United States Patent
Lee

(10) Patent No.: US 8,050,082 B2
(45) Date of Patent: Nov. 1, 2011

(54) TWO-STAGE 8T SRAM CELL DESIGN

(75) Inventor: Cheng Hung Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 477 days.

(21) Appl. No.: 12/259,009

(22) Filed: Oct. 27, 2008

(65) Prior Publication Data

US 2010/0103719 A1  Apr. 29, 2010

(51) Int. Cl.
*G11C 11/00* (2006.01)
(52) U.S. Cl. .............. 365/154; 365/189.09; 365/189.19; 365/194
(58) Field of Classification Search .................. 365/154, 365/189.09, 189.19, 194

See application file for complete search history.

(56) References Cited

U.S. PATENT DOCUMENTS

| | | | | |
|---|---|---|---|---|
| 6,091,626 A | * | 7/2000 | Madan | 365/154 |
| 7,471,544 B2 | * | 12/2008 | Nakazato et al. | 365/154 |
| 7,821,309 B2 | * | 10/2010 | Lee | 327/158 |
| 7,869,261 B2 | * | 1/2011 | Ozawa | 365/154 |

* cited by examiner

*Primary Examiner* — Tuan Nguyen
*Assistant Examiner* — Toan Le
(74) *Attorney, Agent, or Firm* — Slater & Matsil, L.L.P.

(57) ABSTRACT

An integrated circuit device includes a first word-line; a second word-line; a first bit-line; and a static random access memory (SRAM) cell. The SRAM cell includes a storage node; a pull-up transistor having a source/drain region coupled to the storage node; a pull-down transistor having a source/drain region coupled to the storage node; a first pass-gate transistor comprising a gate coupled to the first word-line; and a second pass-gate transistor including a gate coupled to the second word-line. Each of the first and the second pass-gate transistors includes a first source/drain region coupled to the first bit-line, and a second source/drain region coupled to the storage node.

19 Claims, 3 Drawing Sheets

TWO-STAGE 8T SRAM CELL DESIGN

TECHNICAL FIELD

This invention relates generally to semiconductor devices, and more particularly, to memory cells, and even more particularly, to the design of static random access memory cells with improved read static noise margin.

BACKGROUND

Static random access memory (SRAM) cells are commonly used in integrated circuits. SRAM cells have the advantageous feature of holding data without a need for refreshing. FIG. 1 illustrates an exemplary circuit diagram of a typical six-MOS transistor SRAM cell, which includes pass-gate transistors 10 and 24, pull-up transistors 12 and 16, and pull-down transistors 14 and 18. Gates 2 and 4 of the respective pass-gate transistors 10 and 24 are controlled by word-line WL that determines whether the current SRAM cell is selected or not. A latch formed of pull-up transistors 12 and 16 and pull-down transistors 14 and 18 stores a state. The stored state can be read through bit lines BL and BLB.

With the down-scaling of integrated circuits, the operation voltages of SRAM cells are lowered. This causes the reduction in the cell currents, and hence the reduction in the speed in the read operations. The reduction in the read speed may cause sense amplifiers to amplify wrong signals. Further, the lowered operation voltages cause the reduction in static noise margin, which in turn causes the reduction in the read and write margins of the SRAM cells. Reduced read and write margins may cause errors in the respective read and write operations. Conventionally, to improve the read and write margins, dynamic powers were provided. For example, the write margin can be improved by increasing bit-line voltage and/or reducing power supply voltage VDD during the write operations, while the read margin can be improved by reducing bit-line voltage and/or increasing power supply voltage VDD during the read operations. However, such a solution suffers from drawbacks. For example, complicated circuits have to be designed to provide the dynamic power. Additionally, it takes time for the dynamic power to be generated, and thus the read and write operations are slowed down.

Accordingly, new SRAM cells having improved read and write margins, while at the same time overcoming the deficiency of the prior art, are needed.

SUMMARY OF THE INVENTION

In accordance with one aspect of the present invention, an integrated circuit device includes a first word-line; a second word-line; a first bit-line; and a static random access memory (SRAM) cell. The SRAM cell includes a storage node; a pull-up transistor having a source/drain region coupled to the storage node; a pull-down transistor having a source/drain region coupled to the storage node; a first pass-gate transistor including a gate coupled to the first word-line; and a second pass-gate transistor including a gate coupled to the second word-line. Each of the first and the second pass-gate transistors includes a first source/drain region coupled to the first bit-line, and a second source/drain region coupled to the storage node.

In accordance with another aspect of the present invention, an integrated circuit device includes a first word-line; a second word-line parallel to the first word-line; a first bit-line; a second bit-line, wherein the first and the second bit-lines are perpendicular to the first and the second word-lines; and an SRAM cell. The SRAM cell includes a first storage node; a second storage node forming a differential pair with the first storage node; two pull-up transistors, each including a first source/drain region connected to one of the first and the second storage nodes; two pull-down transistors, each including a second source/drain region connected to the one of the first and the second storage nodes; a first pass-gate transistor including a third source/drain region coupled to the first bit-line, a fourth source/drain region coupled to the first storage node, and a first gate coupled to the first word-line; and a second pass-gate transistor including a fifth source/drain region coupled to the first bit-line, a sixth source/drain region coupled to the first storage node, and a second gate coupled to the second word-line.

In accordance with yet another aspect of the present invention, a method of operating an SRAM cell includes providing the SRAM cell, which has a first storage node; and a second storage node forming a differential pair with the first storage node. The method further includes, in a first phase of an operation to the SRAM cell, turning on a first pass-gate transistor to interconnect a first bit-line and the first storage node; and in a second phase of the operation to the SRAM cell, turning on the first pass-gate transistor and a second pass-gate transistor. The second phase is later in time than the first phase. Each of the first and the second pass-gate transistors interconnects the first bit-line and the first storage node.

The advantageous features of the present invention include increased static noise margin without the complexity of using dynamic power.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
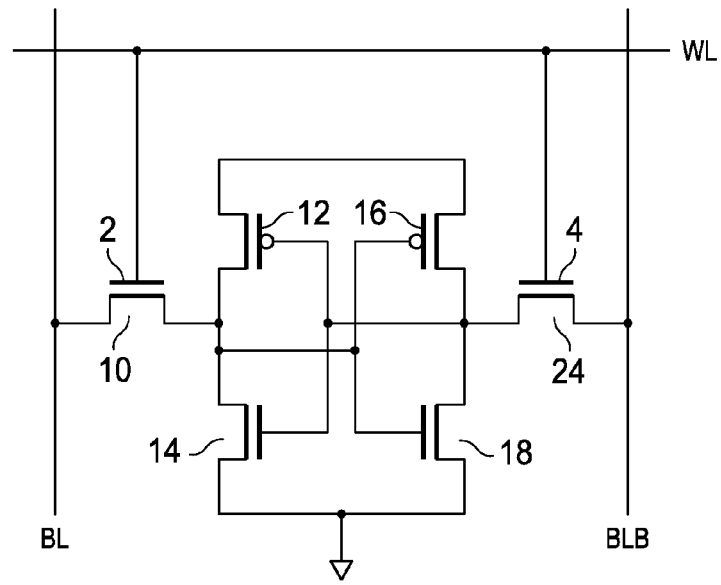
FIG. 1 illustrates a conventional static random access memory (SRAM) cell.
Figure 2:
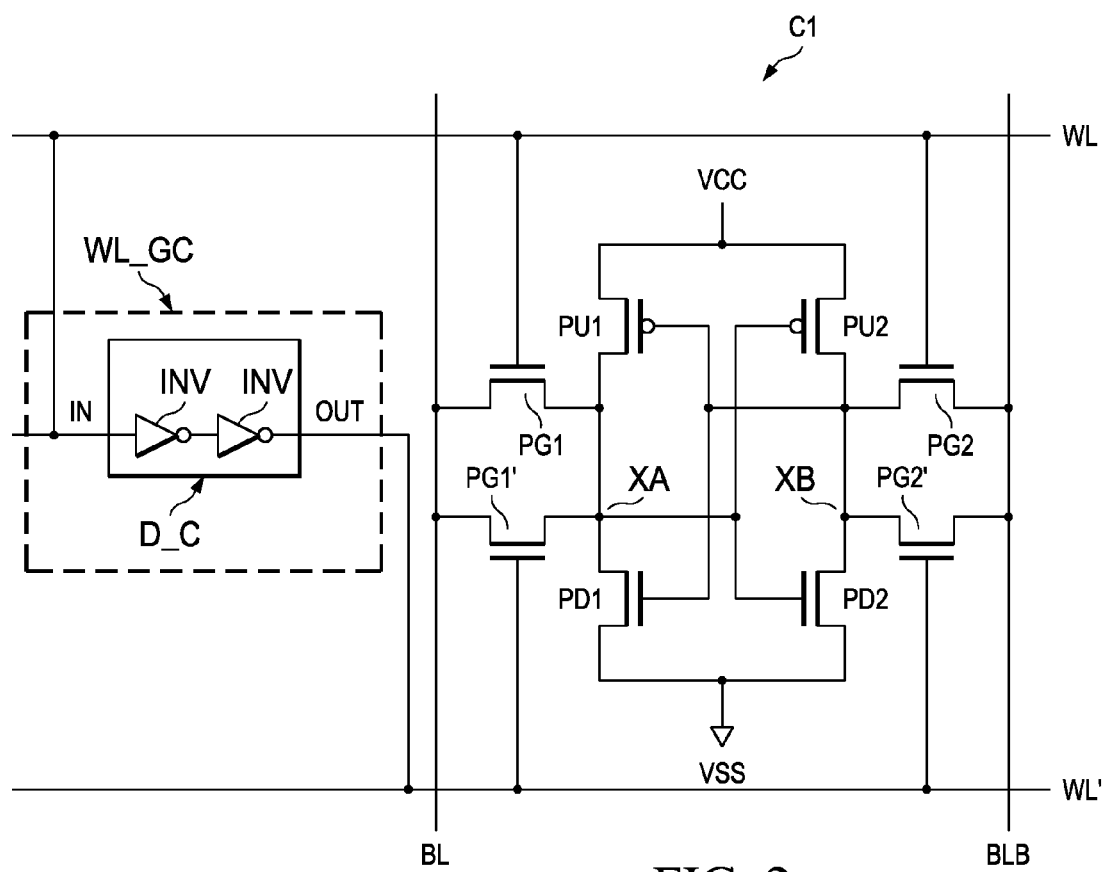
FIG. 2 illustrates an SRAM embodiment of the present invention, wherein additional pass-gate transistors are provided for conducting cell currents.

FIG. 2 illustrates a circuit diagram of a static random access memory (SRAM) cell C1, which includes two pull-up transistors PU1 and PU2 and two pull-down transistors PD1 and PD2. Pull-up transistors PU1 and PU2 and pull-down transistors PD1 and PD2 are coupled to power supply nodes VCC and VSS. Storage node XA, which is the connecting point of the source/drain regions of transistors PU1 and PD1, is coupled to bit-line BL through pass-gate transistors PG1 and PG1'. The gates of pass-gate transistors PG1 and PG1' are connected to word-lines WL and WL', respectively. Each of the pass-gate transistors PG1 and PG1' has a first source/drain region connected to bit-line BL, and a second source/drain region connected to storage node XA.

Similarly, storage node XB, which is the connecting portion of the source/drain regions of transistors PU2 and PD2, is coupled to bit-line BLB through pass-gate transistors PG2 and PG2'. Bit-lines BL and BLB form a differential pair with likely opposite values representing "0" and "1" stored. Storage nodes XA and XB also form a differential pair with likely opposite values representing "0" and "1" stored therein. The gates of pass-gate transistors PG2 and PG2' are connected to word-lines WL and WL', respectively. Each of the pass-gate transistors PG2 and PG2' has a first source/drain region connected to bit-line BLB, and a second source/drain region connected to storage node XB.

Figure 3:
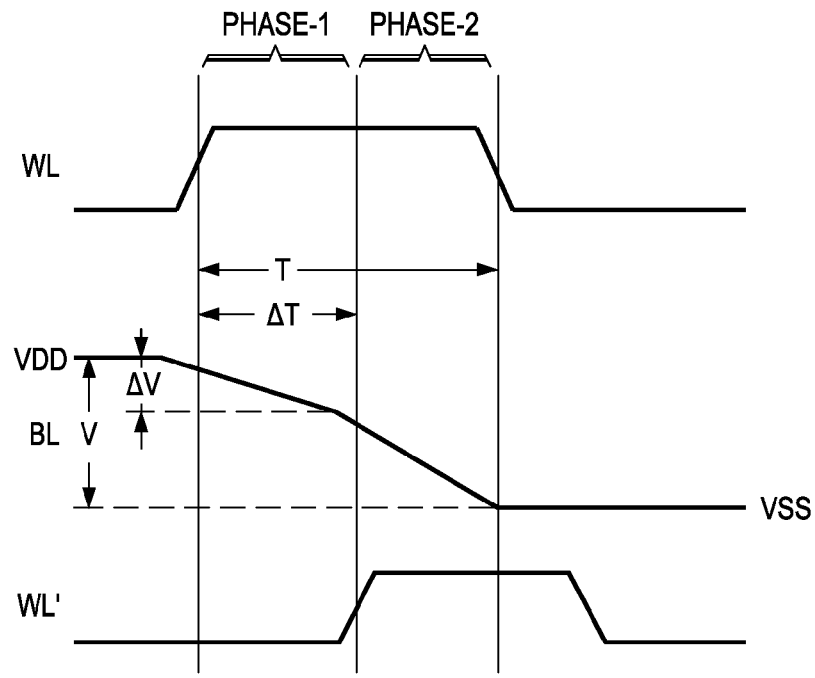
FIG. 3 illustrates an exemplary sequence diagram of a read operation performed to the SRAM cell shown in FIG. 2.

The signal (voltage) carried by word-line WL' is closely related to the signal (voltage) carried by word-line WL. Preferably, word-line WL' is turned on after word-line WL is turned on. In other words, the turn-on time of word-line WL' is delayed from the turn-on time of word-line WL. In an exemplary embodiment, the voltage carried by word-line WL' is essentially the same as, but delayed from, the voltage carried by word-line WL. FIG. 3 illustrates portions of exemplary signals on word-lines WL and WL', wherein the signal on word-line WL' is delayed from the signal on word-line WL by $\Delta T$.

FIG. 2 schematically illustrates an exemplary word-line voltage generating circuit WL_GC for generating the voltages for word-lines WL and WL'. A delay cell D_C, which may be a portion of word-line voltage generating circuit WL_GC, may have an input IN receiving the voltage generated for word-line WL, and output a delayed signal from the voltage for word-line WL, wherein the output OUT is connected to word-line WL'. In an exemplary embodiment as shown in FIG. 2, the delay cell D_C is formed of an even number of inverters Inv.

FIG. 3 illustrates a schematic sequence diagram of a read operation of SRAM cell C1, wherein voltages on word-lines WL and WL' and bit-line BL are illustrated. It is assumed that in the illustrated sequence diagram, storage node XA stores "0," while storage node XB stores "1." If, however, storage node XA stores "1," while storage node XB stores "0," the line denoted as BL will represent the voltage on bit-line BLB, instead of bit-line BL.

In the beginning of the read operation, bit-lines BL and BLB are pre-charged to VDD (or VCC). During the first phase (phase-1) of the read operation, word-line WL is turned on (please refer to the rising edge), and hence pass-gate transistor PG1 (refer to FIG. 2) is turned on to conduct a current (referred to as cell current hereinafter). Since storage node XA stores "0," and hence has the voltage of VSS, bit-line BL starts to discharge to storage node XA. The voltage on bit-line BL thus decreases. During phase-1, word-line WL' remains off (at a low voltage, for example, VSS), and hence pass-gate transistor PG1' is also off. Advantageously, with only pass-gate transistor PG1 being turn on, the on-resistance between storage node XA and bit-line BL is relatively high, and hence SRAM cell C1 is affected less by the static noise on bit-line BL.

After delay time $\Delta T$, the second phase (phase-2) of the read operation starts. During phase-2, word-line WL' is also turned on in addition to word-line WL, and pass-gate transistors PG1 and PG1' are both turned on to conduct a higher cell current for the discharging of bit-line BL to storage node XA. Accordingly, the voltage (denoted as BL in FIG. 3) on bit-line BL drops at a faster rate than in phase-1. During phase-2, since the voltage on bit-line BL is already reduced to lower than VDD, the static noise on bit-line BL is less likely to disturb SRAM cell C1 to cause erroneous reading. Further, the cell current is significantly greater in phase-2 than in phase-1, even if the SRAM cell C1 cannot be successfully read in phase-1, it will be read in phase-2.

It is realized that the optimum delay time $\Delta T$ is affected by several factors, such as the cell current that can be conducted by pass-gate transistors PG1 and PG2, the voltage VCC, the likely noise level on bit-lines BL and BLB, or the like. Preferably, the delay time $\Delta T$ is selected based on the desirable voltage drop $\Delta V$ on bit-line BL (or BLB if storage node XB stores "0"), wherein the desirable voltage drop $\Delta V$ is related to the expected static noise level. Preferably, the greater the expected static noise level is, the greater the voltage drop $\Delta V$ is desirable. In an exemplary embodiment, voltage drop $\Delta V$ is between about 20 and 30 percent of voltage amplitude V, wherein the voltage amplitude V equals (VDD−VSS), as shown in FIG. 3.

On the other hand, the delay time $\Delta T$ is preferably between about 20 percent and about 80 percent of the turn-on duration T of word-line WL. Again, the optimum delay time $\Delta T$ is affected by various factors, such as the cell currents of pass-gate transistors PG1, PG1', PG2, and PG2'. The optimum delay time $\Delta T$ may be found through experiments.

The sequence diagram shown in FIG. 3 reflects the voltages of SRAM cell C1 when it is selected for the read operation. If SRAM cell (and the corresponding row of the SRAM cell) C1 is not selected for the read operation, the respective word-line WL, and hence word-line WL', will not be turned on.

Figure 4:
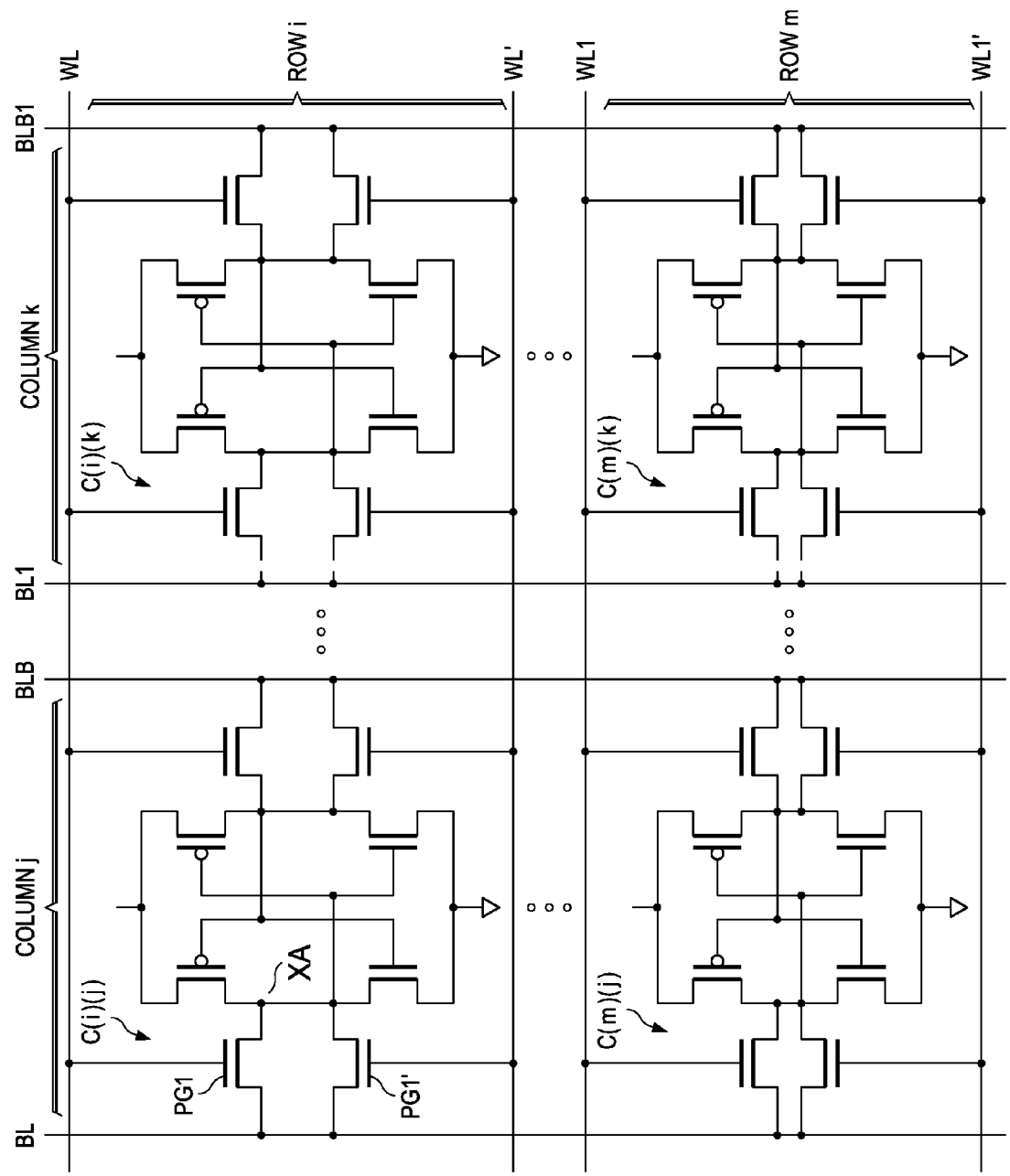
FIG. 4 illustrates a portion of a SRAM array comprising the SRAM shown in FIG. 2.

FIG. 4 illustrates a portion of an SRAM array formed of a plurality of SRAM cells arranged in rows and columns, wherein each of the SRAM cells in the SRAM array may have a structure similar to what is shown in FIG. 2. Each of the SRAM cells in the SRAM array may be referred to using their respective row number and column number. For example, the SRAM cell at row i and column j may be referred to as C(i)(j). Write operations of the SRAM cells are discussed with reference to FIG. 4. Assuming in a write operation, cell C(i)(j) is selected to be written into, while the SRAM cells in row m and the SRAM cells in column k are not selected. Accordingly, during the write operation, only word-lines WL and WL' are turned on, while word-lines WL1 and WL1' remain off.

Figure 5:
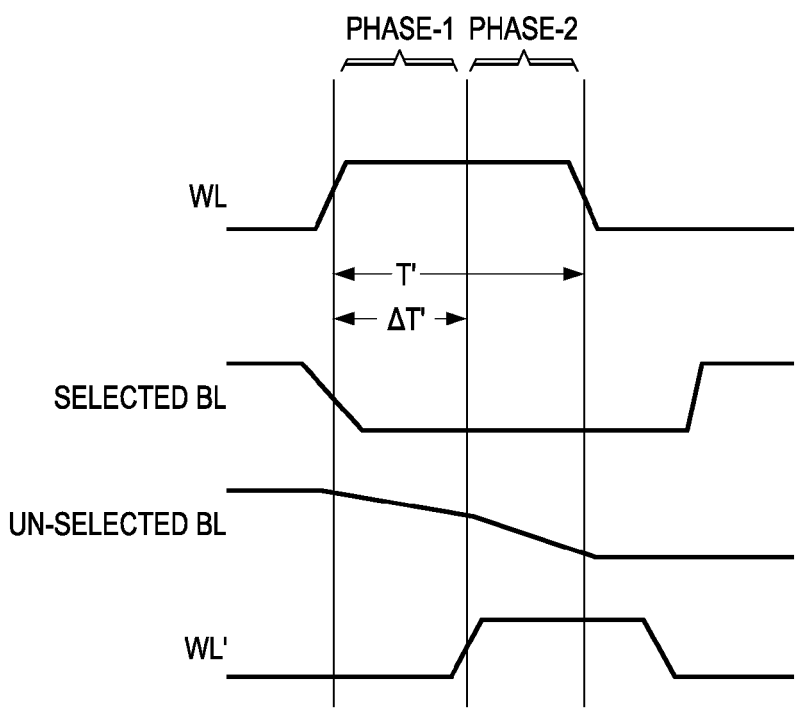
FIG. 5 illustrates an exemplary sequence diagram of a write operation performed to the SRAM array shown in FIG. 4.

A sequence diagram of the write operation is shown in FIG. 5. In the phase-1 of the write operation, bit-lines BL and BLB are pre-charged to the differential voltages that will be written into SRAM cell C(i)(j). In the example shown in FIG. 4, bit-line BL is pre-charged to VDD. The voltage on bit-line BL is illustrated using the line denoted as "Selected BL." In the beginning of phase-1, word-line WL is turned on (please refer to the rising edge), and hence pass-gate transistor PG1 (refer to FIG. 2) of SRAM cell C(i)(j) is turned on. During phase-1, word-line WL' remains off, and hence pass-gate transistor PG1' of SRAM cell C(i)(j) is also off. With only one of pass-gate transistors PG1 and PG1', but not both, being turned on, the on-resistance between storage node XA and bit-line BL is relatively high, and hence SRAM cell C1 is affected less by the static noise on bit-line BL.

In phase-2 of the write operation, word-line WL' is also turned on (please refer to the rising edge), and pass-gate transistors PG1 and PG1' are both turned on to conduct a higher cell current for writing into storage node XA. In the case SRAM cell C(i)(j) is a weak cell and the preferred data is not successfully written into SRAM cell C(i)(j) during phase-1, the preferred data will be written into SRAM cell C(i)(j) during phase-2.

Referring again to FIG. 4, since the SRAM cells in row m is not selected, during the write operation, word-lines WL1 and WL1' are both turned off, and no writing is performed to the SRAM cells in row m.

Also, at the time SRAM cell C(i)(j) is written into, word-lines WL and WL' are turned on even though SRAM cell C(i)(k) is not selected to be written into, a dummy read will thus be performed to SRAM cell C(i)(k). Referring to FIG. 5, the line indicated as "Un-selected BL" represents the voltage on bit-line BL1, again assuming the storage node XA of cell C(i)(k) stores "0." It is noted that the behavior of the voltage on bit-line BL1 is essentially the same as the voltage on bit-line BL as shown in FIG. 3. FIG. 5 illustrates that the turn-on time of word-line WL' is delayed for delay time ΔT', which is less than the turn-on duration T' of word-line WL. In an embodiment, turn-on duration T' as shown in FIG. 5 is equal to the turn-on duration T as shown in FIG. 3. Again, the optimum delay time ΔT' is affected by various factors, and may be found through experiments. The ratio of ΔT'/T' for the write operation may be equal to, greater than, or smaller than, the ratio ΔT/T (refer to FIG. 3) for the read operation.

It is noted that although in the embodiments discussed in the preceding paragraphs, pass-gate transistors PG1' and PG2' and word-line WL' are added to six-transistor (6T) SRAM cells, other commonly used SRAM cells, such as 8T, 10T, and 12T SRAM cells, may also have the pass-gate transistors PG1' and PG2', word-line WL', and the word-line voltage generating circuit WL_GC (refer to FIG. 2) added on.

The embodiments of the present invention have several advantageous features. By separating the read and write operations of SRAM cells into two phases, the static noise margin may be improved. Unlike a conventional dynamic power solution that requires dual power, the embodiment of the present invention is less complicated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
   a first word-line;
   a second word-line;
   a first bit-line;
   a static random access memory (SRAM) cell comprising:
      a storage node;
      a pull-up transistor having a source/drain region coupled to the storage node;
      a pull-down transistor having a source/drain region coupled to the storage node;
      a first pass-gate transistor comprising a gate coupled to the first word-line; and
      a second pass-gate transistor comprising a gate coupled to the second word-line, wherein each of the first and the second pass-gate transistors comprises a first source/drain region coupled to the first bit-line, and a second source/drain region coupled to the storage node;
   a word-line voltage generating circuit configured to:
      receive first word-line signals applied on the first word-line, wherein the first word-line signals comprise rising edges and falling edges;
      generate second word-line signals by delaying the first word-line signals for a delay time; and
      output the second word-line signals to the second word-line.

2. The integrated circuit device of claim 1, wherein the delay time is less than a turn-on duration of the first word-line.

3. The integrated circuit device of claim 2, wherein the delay time is between about 20 to about 80 percent of the turn-on duration.

4. The integrated circuit device of claim 1, wherein the word-line voltage generating circuit comprises an even number of inverters connected in series, with an input of the series of inverters connected to the first word-line, and an output of the series of inverters connected to the second word-line.

5. The integrated circuit device of claim 1 further comprising:
   an additional storage node, wherein the storage node and the additional storage node form a differential pair;
   an additional pull-up transistor having a source/drain region coupled to the additional storage node;
   an additional pull-down transistor having a source/drain region coupled to the additional storage node;
   a second bit-line forming a differential pair with the first bit-line;
   a third pass-gate transistor comprising a gate coupled to the first word-line; and
   a fourth pass-gate transistor comprising a gate coupled to the second word-line, wherein each of the third and the fourth pass-gate transistors comprises a first source/drain region coupled to the second bit-line, and a second source/drain region coupled to the additional storage node.

6. The integrated circuit device of claim 1, wherein the word-line voltage generating circuit is configured to delay both rising edges and the falling edges of the first word-line signals to generate the second word-line signals.

7. An integrated circuit device comprising:
   a first word-line;
   a second word-line parallel to the first word-line;
   a first bit-line;
   a second bit-line, wherein the first and the second bit-lines are perpendicular to the first and the second word-lines;
   a static random access memory (SRAM) cell comprising:
      a first storage node;
      a second storage node forming a differential pair with the first storage node;
      two pull-up transistors, each comprising a first source/drain region connected to one of the first and the second storage nodes;
      two pull-down transistors, each comprising a second source/drain region connected to the one of the first and the second storage nodes;
      a first pass-gate transistor comprising a third source/drain region coupled to the first bit-line, a fourth source/drain region coupled to the first storage node, and a first gate coupled to the first word-line; and a second pass-gate transistor comprising a fifth source/drain region coupled to the first bit-line, a sixth source/drain region coupled to the first storage node, and a second gate coupled to the second word-line; and a delay cell comprising an even number of inverters connected in series, wherein the delay cell comprises an input connected to the first word-line, and an output connected to the second word-line.

8. The integrated circuit device of claim 7 further comprising:

a third pass-gate transistor-comprising a seventh source/drain region coupled to the second bit-line, an eighth source/drain region coupled to the second storage node, and a third gate coupled to the first word-line; and a fourth pass-gate transistor comprising a ninth source/drain region coupled to the second bit-line, a tenth source/drain region coupled to the second storage node, and a fourth gate coupled to the second word-line.

9. The integrated circuit device of claim 7, wherein the delay cell is configured to delay a delay time less than a turn-on duration of the first word-line.

10. The integrated circuit device of claim 9, wherein the delay time is between about 20 to about 80 percent of the turn-on duration.

11. The integrated circuit device of claim 7, wherein the delay cell is configured to delay both rising edges and the falling edges signals on the first word-line.

12. A method of operating a static random access memory (SRAM) cell, the method comprising:

providing the SRAM cell comprising:
a first storage node; and
a second storage node forming a differential pair with the first storage node;

in a first phase of an operation to the SRAM cell, turning on a first pass-gate transistor to interconnect a first bit-line and the first storage node;

delaying first word-line signals provided to a gate of the first pass-gate transistor to generate second word-line signals, wherein the step of delaying the first word-line signals comprises:

delaying first rising edges of the first word-line signals by a first delay time to generate second rising edges of the second word-line signals; and delaying first falling edges of the first word-line signals by a second delay time to generate second falling edges of the second word-line signals; and in a second phase of the operation to the SRAM cell, turning on the first pass-gate transistor and a second pass-gate transistor using the second word-line signals, wherein each of the first and the second pass-gate transistors interconnects the first bit-line and the first storage node, and wherein the second phase is later in time than the first phase.

13. The method of claim 12, wherein the operation is a write operation.

14. The method of claim 12, wherein the operation is a read operation.

15. The method of claim 12, wherein the operation is a dummy read operation.

16. The method of claim 12, wherein the first pass-gate transistor is turned on for a period of time before the first pass-gate transistor is turned off, and wherein the first phase has a duration between about 20 percent to about 80 percent of the period of time.

17. The method of claim 12, wherein at a first time the first phase begins, the first bit-line has a first voltage, and at a second time the second phase begins, the first bit-line has a second voltage, and wherein the second voltage is less than about 80 percent of the first voltage.

18. The method of claim 12, wherein the step of delaying the first word-line signal comprises supplying the word-line-signals to an input of a plurality of serially connected inverters, and receiving output signals from the plurality of serially connected inverters as the second word-line signals.

19. The method of claim 12 further comprising:

in the first phase, turning on a third pass-gate transistor to interconnect a second bit-line and the second storage node, wherein the first and the second bit-lines form a differential pair; and in the second phase, turning on the third pass-gate transistor and a fourth pass-gate transistor, wherein each of the third and the fourth transistors interconnects the second bit-ine and the second storage node.

* * * * *